(12) United States Patent
Chitiboi et al.

(10) Patent No.: US 11,615,529 B2
(45) Date of Patent: Mar. 28, 2023

(54) AUTOMATIC, DYNAMIC, AND ADAPTIVE SLICE PLANNING FOR CARDIAC MRI ACQUISITION

(71) Applicant: Siemens Healthcare GmbH, Erlangen (DE)

(72) Inventors: Teodora Chitiboi, Jersey City, NJ (US); Saikiran Rapaka, Pennington, NJ (US); Puneet Sharma, Princeton Junction, NJ (US); Jens Wetzl, Spardorf (DE); Christian Geppert, Erlangen (DE); Michaela Schmidt, Uttenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 71 days.

(21) Appl. No.: 16/951,533

(22) Filed: Nov. 18, 2020

(65) Prior Publication Data

US 2022/0156918 A1 May 19, 2022

(51) Int. Cl.
*G06T 7/00* (2017.01)
*G01R 33/54* (2006.01)

(52) U.S. Cl.
CPC .......... *G06T 7/0012* (2013.01); *G01R 33/543* (2013.01); *G06T 2207/10088* (2013.01); *G06T 2207/20081* (2013.01); *G06T 2207/20084* (2013.01); *G06T 2207/30048* (2013.01)

(58) Field of Classification Search
CPC ......... G06T 7/0012; G06T 2207/10088; G06T 2207/20081; G06T 2207/20084; G06T 2207/30048; G01R 33/543

USPC ........................................................ 382/128
See application file for complete search history.

(56) References Cited

U.S. PATENT DOCUMENTS

| | | | |
|---|---|---|---|
| 6,587,597 B1* | 7/2003 | Nakao | H04N 5/23238 382/284 |
| 9,968,257 B1* | 5/2018 | Burt | A61B 5/0035 |
| 2004/0091084 A1* | 5/2004 | Griffith | G06T 19/00 378/210 |
| 2011/0228998 A1 | 9/2011 | Vaidya et al. | |
| 2015/0043774 A1 | 2/2015 | Harder et al. | |
| 2017/0311839 A1* | 11/2017 | Osman | G16H 30/40 |
| 2020/0074664 A1* | 3/2020 | Weber | G06T 17/00 |
| 2020/0170615 A1* | 6/2020 | Roundhill | A61B 8/0866 |
| 2020/0258216 A1 | 8/2020 | Sharma et al. | |
| 2020/0383584 A1* | 12/2020 | Osman | A61B 5/0044 |
| 2021/0142887 A1* | 5/2021 | Gheorghita | G16H 50/20 |

OTHER PUBLICATIONS

Blansit et al., "Deep Learning-based Prescription of Cardiac MRI Planes", Radiology: Artificial Intelligence, Nov. 27, 2019, https://doi.org/10.1148/ryai.2019180069. (Year: 2019).*
Blansit et al., "Deep Learning-based Prescription of Cardiac MRI Planes", Radiology: Artificial Intelligence, Nov. 27, 2019, https://doi.org/10.1148/ryai.2019180069.

* cited by examiner

*Primary Examiner* — Van D Huynh

(57) ABSTRACT

Systems and methods for predicting a location for acquiring a target view of an anatomical object of interest in an input image are provided. An input image of an anatomical object of interest of a patient is received. An output image is generated using a machine learning based network. The output image depicts a projection of a 3D image plane for acquiring a target view of the anatomical object of interest identified on the input image. The output image is output.

18 Claims, 9 Drawing Sheets

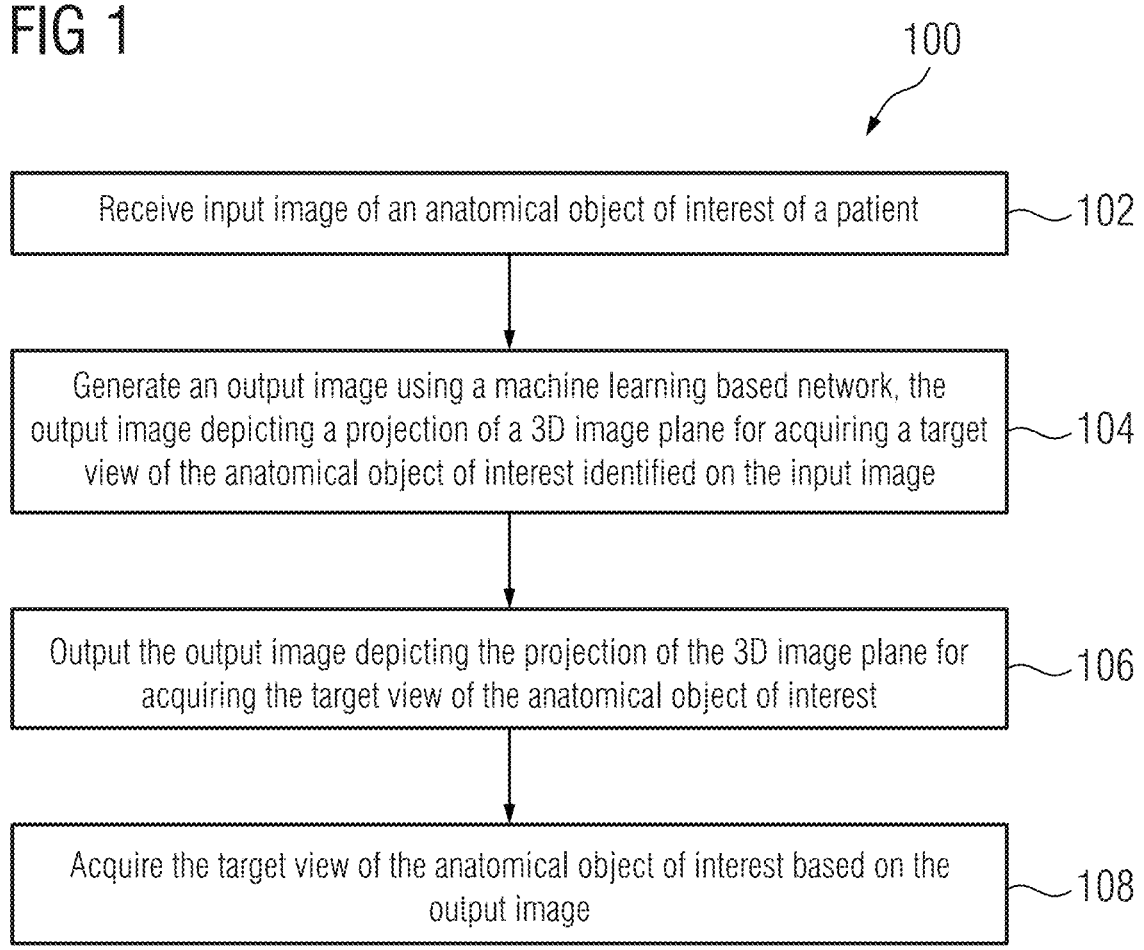

FIG 3
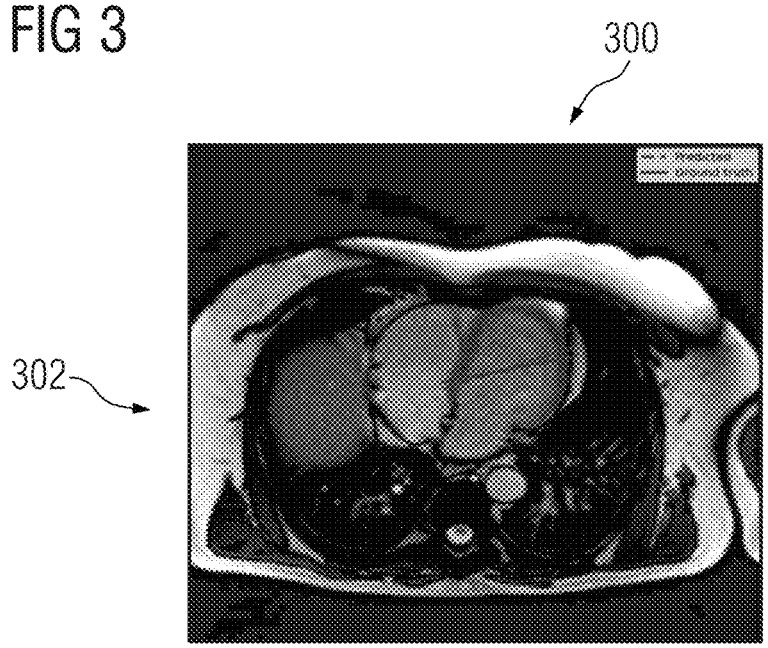
302
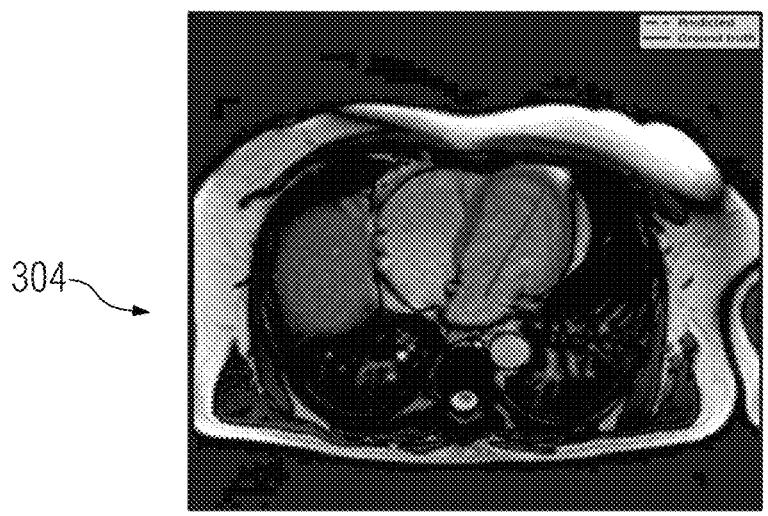
304
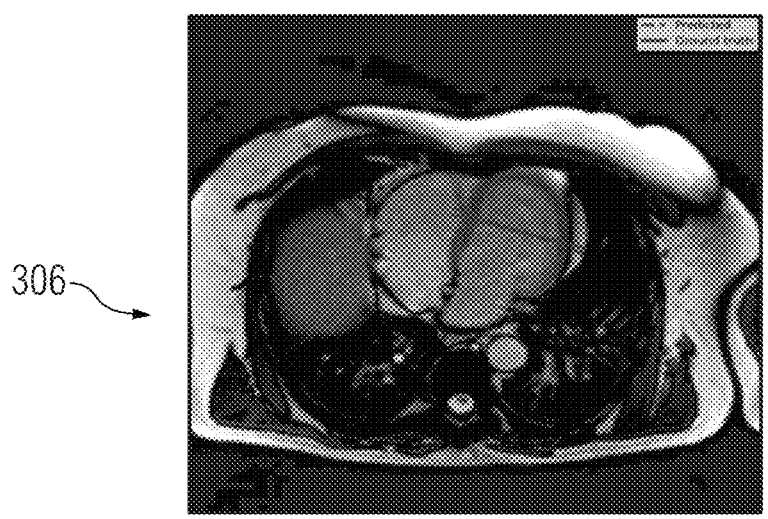
306

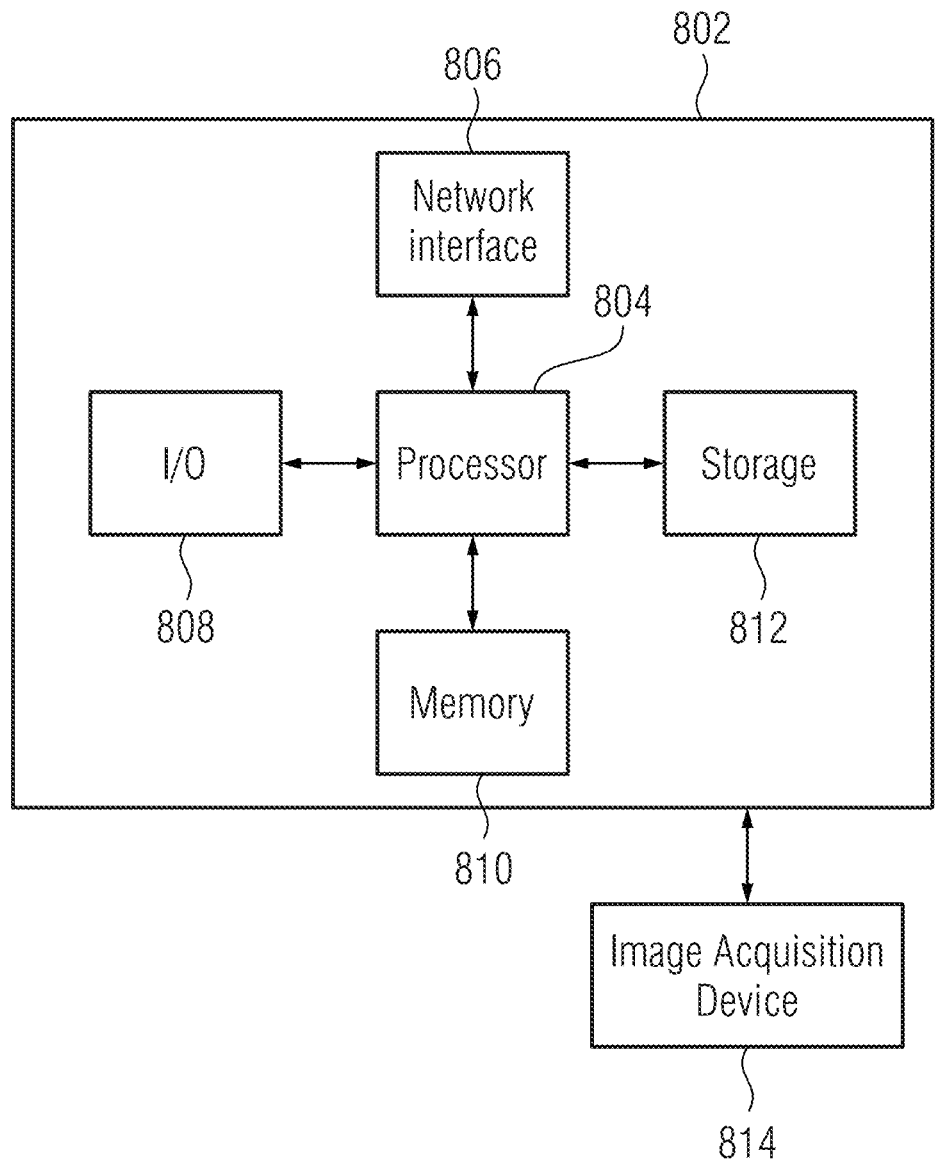

AUTOMATIC, DYNAMIC, AND ADAPTIVE SLICE PLANNING FOR CARDIAC MRI ACQUISITION

TECHNICAL FIELD

The present invention relates generally to automatic, dynamic, and adaptive slice planning for cardiac MRI (magnetic resonance imaging) acquisition, and in particular to an artificial intelligence based approach for predicting a location for acquiring a target view of the heart of a patient for automatic, dynamic, and adaptive slice planning for cardiac MRI acquisition.

BACKGROUND

Cardiac MRI (magnetic resonance imaging) examinations may be performed to assess the heart of a patient for various cardiovascular diseases, such as atherosclerosis, cardiomyopathy, congenital heart disease, heart failure, aneurysm, heart valve disease, cardiac tumor, etc. Typically, a cardiac MRI examination requires several views of the heart. For example, a cardiac MRI examination may require a short axis view of the heart, a long axis view of the heart, a 2 chamber view of the heart, a 3 chamber view of the heart, a 4 chamber view of the heart, etc. Traditionally, the views of the heart required for a cardiac MRI examination are manually acquired by a radiologist. However, such manual acquisition of images requires that the radiologist follow a complex set of protocols, which may be difficult to follow and time consuming for untrained and unexperienced radiologists. Recently, conventional semi-automatic methods for acquiring images for a cardiac MRI examination have been proposed. However, such conventional semi-automatic methods rely on the identification of specific landmarks, which requires the acquisition of an additional localizer image, or the generation of an anatomical model of the target anatomical structure to be imaged.

BRIEF SUMMARY OF THE INVENTION

In accordance with one or more embodiments, systems and methods for predicting a location for acquiring a target view of an anatomical object of interest in an input image are provided. An input image of an anatomical object of interest of a patient is received. An output image is generated using a machine learning based network. The output image depicts a projection of a 3D image plane for acquiring a target view of the anatomical object of interest identified on the input image. The output image is output.

In one embodiment, the projection of the 3D image plane for acquiring the target view of the anatomical object of interest is determined based on an intersection of an imaging plane of the input image and an imaging plane of the target view. The projection of the 3D image plane for acquiring the target view of the anatomical object of interest may be a line in the input image representing the intersection or a continuous region defined by a pair of boundary lines. The continuous region is determined by computing a distance transform based on a distance between the intersection and points extending away from the intersection.

In one embodiment, one or more additional input images of the anatomical object of interest are received and the output image is generated using the machine learning based network from the one or more additional input images.

In one embodiment, the input image comprises a localizer image or a previously acquired target view of the anatomical object of interest. In one embodiment, the anatomical object of interest is a heart of the patient. In one embodiment, the target view comprises one of a short axis view, a 2-chamber view, a 3-chamber view, or a 4-chamber view of the heart.

In one embodiment, the target view of the anatomical object of interest is acquired based on the output image.

These and other advantages of the invention will be apparent to those of ordinary skill in the art by reference to the following detailed description and the accompanying drawings.

BRIEF DESCRIPTION OF THE DRAWINGS

FIG. 1 shows a method for determining a location for acquiring a target view of an anatomical object of interest in an input image, in accordance with one or more embodiments;

FIG. 3 shows images comparing ground truth locations with predicted locations for acquiring a target view of the heart predicted in accordance one or more embodiments;

FIG. 8 shows a high-level block diagram of a computer that may be used to implement one or more embodiments.

DETAILED DESCRIPTION

Figure 2A:
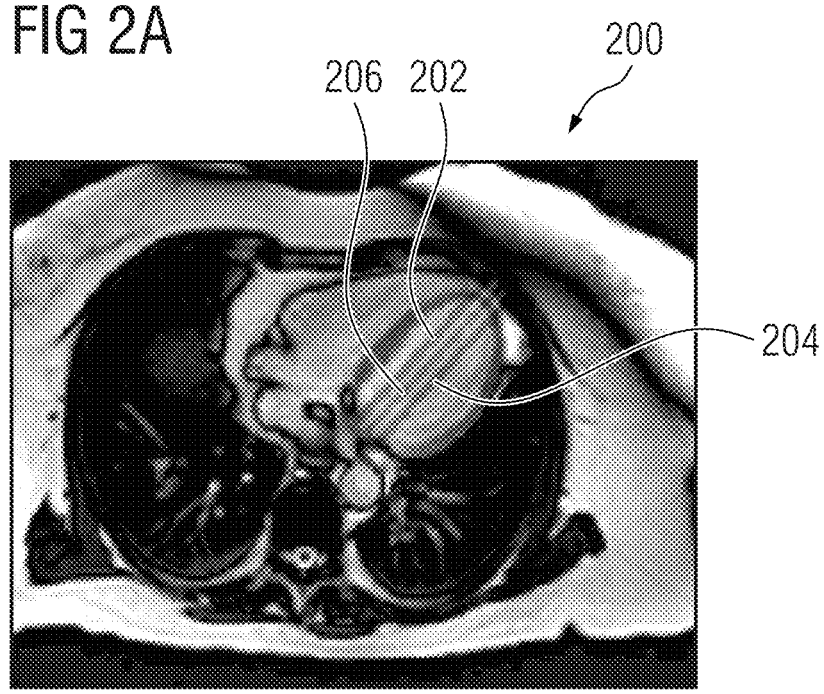
FIGS. 2A-2D show exemplary output images generated in accordance with one or more embodiments.

The present invention generally relates to methods and systems for automatic, dynamic, and adaptive slice planning for cardiac MRI (magnetic resonance imaging) acquisition. Embodiments of the present invention are described herein to give a visual understanding of such methods and systems. A digital image is often composed of digital representations of one or more objects (or shapes). The digital representation of an object is often described herein in terms of identifying and manipulating the objects. Such manipulations are virtual manipulations accomplished in the memory or other circuitry/hardware of a computer system. Accordingly, is to be understood that embodiments of the present invention may be performed within a computer system using data stored within the computer system.

A cardiac MRI examination may require the acquisition of various target views of the heart, such as, e.g., a short axis (SAX) view, a long axis (LAX) view, a 2 chamber (2Ch) view, a 3 chamber (3Ch) view, a 4 chamber (4Ch) view, a right ventricular outflow tract (RVOT) view, a left ventricular outflow tract (LVOT) view, cross sectional views of the valves, aortic views, etc. Embodiments described herein provide for a machine learning based model for automatically predicting a location for acquiring a target view of the heart of a patient in an input image. Advantageously, the predicted location for acquiring the target view of the heart, predicted in accordance with embodiments described herein, guide and enable an unexperienced or untrained user (e.g., radiologist or MRI technologist) to navigate the imaging device and acquire the target view of the heart, without having to follow a complex set of protocols guiding the user to a location for acquiring the target view. Additionally, embodiments described herein do not rely on the identification of specific landmarks or the generation of an anatomical model of the heart. Additionally, embodiments described herein do not require the acquisition of additional specific image localizers that are not already traditionally part of the imaging exam, thus shortening the acquisition time compared to landmark-based methods.

FIG. 1 shows a method 100 for determining a location for acquiring a target view of an anatomical object of interest in an input image, in accordance with one or more embodiments. The steps of method 100 may be performed by one or more suitable computing devices, such as, e.g., computer 802 of FIG. 8.

At step 102, an input image of an anatomical object of interest of a patient is received. In one embodiment, the anatomical object of interest of the patient is a heart of the patient. However, the anatomical object of interest may be any anatomical object of interest of the patient, such as, e.g., an organ, a bone, or any other anatomical structure of the patient.

In one embodiment, the input image is an MRI (magnetic resonance imaging) image. For example, the input image may be an MRI localizer image or a cine MRI image sequence. However, the input image may be of any other suitable modality, such as, e.g., CT (computed tomography), x-ray, US (ultrasound), or any other modality or combination of modalities. The input image may comprise 2D (two dimensional) images or 3D (three dimensional) volumes, and may comprise a single image or a plurality of images (e.g., a sequence of images acquired over time).

In one embodiment, one or more additional input images may also be received. For example, the one or more additional input images may include previously acquired target views of the anatomical object of interest. The previously acquired target views may have been acquired based on prior iterations of method 100.

The input image and/or the one or more additional input images may be received directly from an image acquisition device, such as, e.g., an MRI scanner, as the images are acquired, or can be received by loading previously acquired input images from a storage or memory of a computer system or receiving the input images from a remote computer system.

At step 104, an output image is generated using a machine learning based network. The output image depicts a projection of a 3D image plane for acquiring a target view of the anatomical object of interest identified on the input image. In one embodiment, the target view is an imaging plane of the anatomical object of interest that depicts the anatomical object of interest at an anatomical orientation. For example, the target view may comprise a SAX view, a LAX view (such as, e.g., a 2Ch view, a 3Ch view, a 4Ch view, etc.), a RVOT view, a LVOT view, cross sectional views of the valves, aortic views, etc. for performing a cardiac MRI examination. However, it should be understood that the target view may include any other suitable view of the anatomical object of interest.

In one embodiment, the machine learning based network is a deep convolutional neural network (CNN). However, the machine learning based network may be any other suitable machine learning based network. The machine learning based network is trained during a prior offline or training stage using a training data set to predict a location for acquiring a particular target view of the anatomical object of interest. The training data set comprises training images of the anatomical object of interest annotated with the location for acquiring the particular target view of the anatomical object of interest. Once trained, the trained machine learning based network is applied at step 104, at an online or inference stage, to predict the location for acquiring the particular target view of the anatomical object of interest in the input image. In particular, the trained machine learning based network receives as input the input image, and possibly in some embodiments the one or more additional input images, and outputs the output image.

The projection of the 3D image plane for acquiring a target view of the anatomical object of interest represents a 3D spatial plane position and orientation in the input image at which the target view may be acquired. The projection of the 3D image plane may be predicted by the trained machine learning based network by computing a distance transform based on the input image. The distance transform has a value of 0 at the intersection of the imaging plane of the input image and the imaging plane of the target view. The intersection represents the exact location for acquiring the target view of the anatomical object of interest in the input image. The distance transform has increasingly positive values extending away from the intersection (e.g., up to a predetermined amount). The increasingly positive values may be calculated as a distance (e.g., a normalized Euclidean distance or any other suitable distance function) between the intersection and points extending away from the intersection. The location may be represented in the output image in any suitable form. In one embodiment, the location may be represented in the output image as a 2D line of the intersection of the imaging plane of the input image and the imaging plane of the target view. In another embodiment, the location in the output image may be represented as a continuous region in the output image based on the distance transform.

Figure 2B:
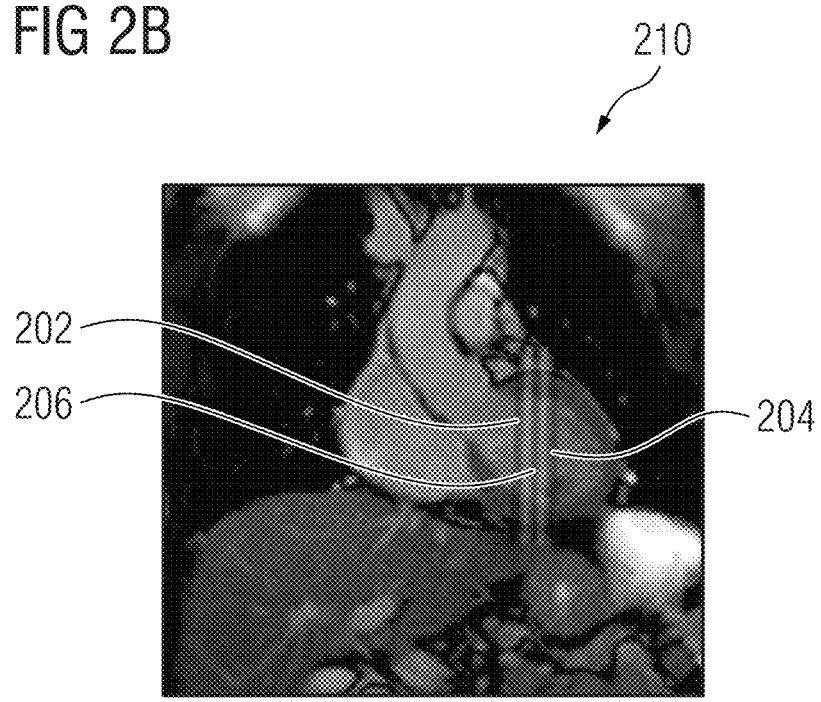
Figure 2C:
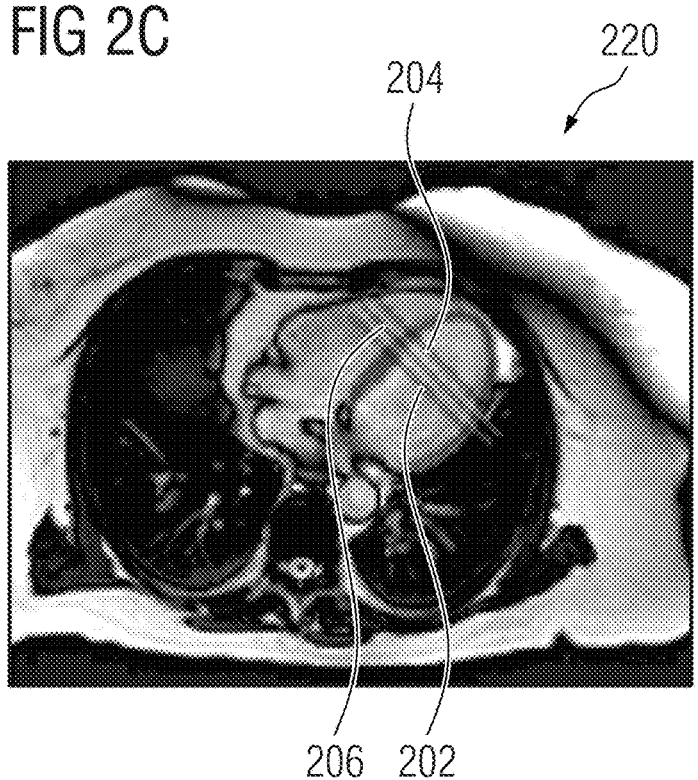
Figure 2D:
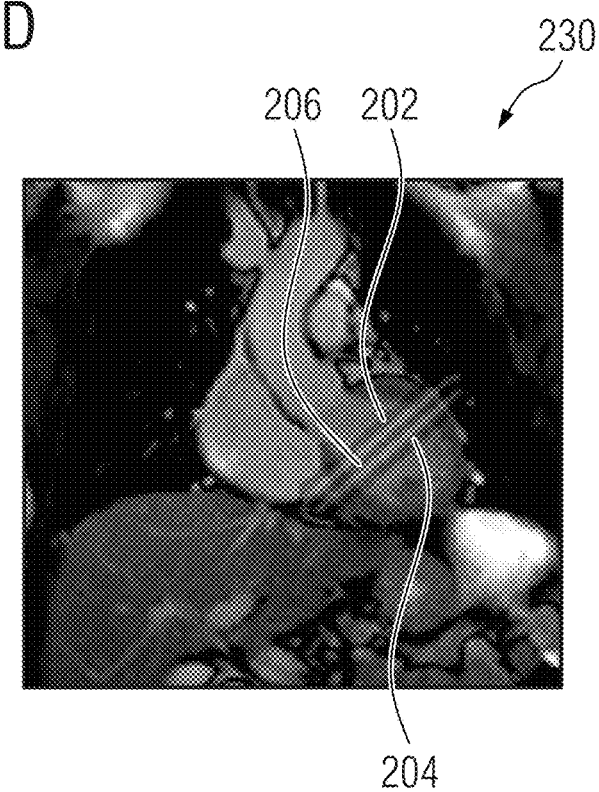

FIGS. 2A-2D show exemplary output plane locations, generated in accordance with one or more embodiments. FIG. 2A shows an output plane location 200 of a 2Ch view of the heart of a patient generated from an axial scout input image. FIG. 2B shows an output plane location 210 of a 2Ch view of the heart of a patient generated from a coronal scout input image. FIG. 2C shows an output plane location 220 of a mid-ventricular SAX view of the heart of a patient generated from an axial scout input image. FIG. 2D shows an output plane location 230 of a mid-ventricular SAX view of the heart of a patient generated from a coronal scout input image. Output plane locations 200, 210, 220, and 230 identify the location for acquiring a target view of the heart in the input image as a continuous region, representing the distance transform from the line intersection of the input image with the target imaging plane. The continuous region is defined as being between a pair of boundary lines 202 and 204. A 2D line segment 206, positioned in the middle of the pair of boundary lines 202 and 204, represents the intersection of the imaging plane of the input image and the imaging plane of the target view and has a distance transform value of zero. Line 206 represents the exact 2D projection of the plane for acquiring the target view of the heart. The distance transform has increasingly positive values extending away from line 206 to the pair of boundary lines 202 and 204 representing the distance from line 206.

In one embodiment, where the one or more additional input images are also input into the machine learning based network, the machine learning based network predicts the location for acquiring the target view of the anatomical object of interest by computing, for each respective image (i.e., the input image and additional input images), a single 2D line representing the intersection of the imaging plane of the respective image and the imaging plane of the target view through regression. By determining 2 or more 2D line intersections of the same 3D imaging plane of the target view in multiple images, the full 3D plane orientation for the target view is computed.

At step 106, the output image depicting the projection of the 3D image plane for acquiring the target view of the anatomical object of interest is output. For example, the output image can be output by displaying the output image on a display device of a computer system, storing the output image on a memory or storage of a computer system, or by transmitting the output image to a remote computer system.

At step 108, the target view of the anatomical object of interest is acquired based on the output image. For example, the MRI scanner may automatically navigate to the projection of the 3D image plane identified in the output image and acquire the target view of the anatomical object of interest.

FIG. 3 shows images 300 comparing ground truth locations with predicted locations for acquiring a target view of the heart predicted in accordance embodiments described herein. Image 302 shows a SAX view, image 304 shows a 2Ch view, and image 306 shows a 4Ch view. Images 302, 304, and 306 show a predicted location for acquiring a LAX target view in dashed lines and ground truth plane in solid lines.

In one embodiment, method 100 of FIG. 1 may be repeated for a number of iterations to predict the location for acquiring other target views of the same anatomical object or different anatomical objects (e.g., to acquire images of the heart, as well as additional views of the aorta and pulmonary artery). In particular, one or more of the iterations may use an acquired target view, acquired during a prior iteration of method 100, as the additional input image. Each iteration would respectively apply a separately trained machine learning based model trained for predicting a location for acquiring a particular target view.

Figure 4:
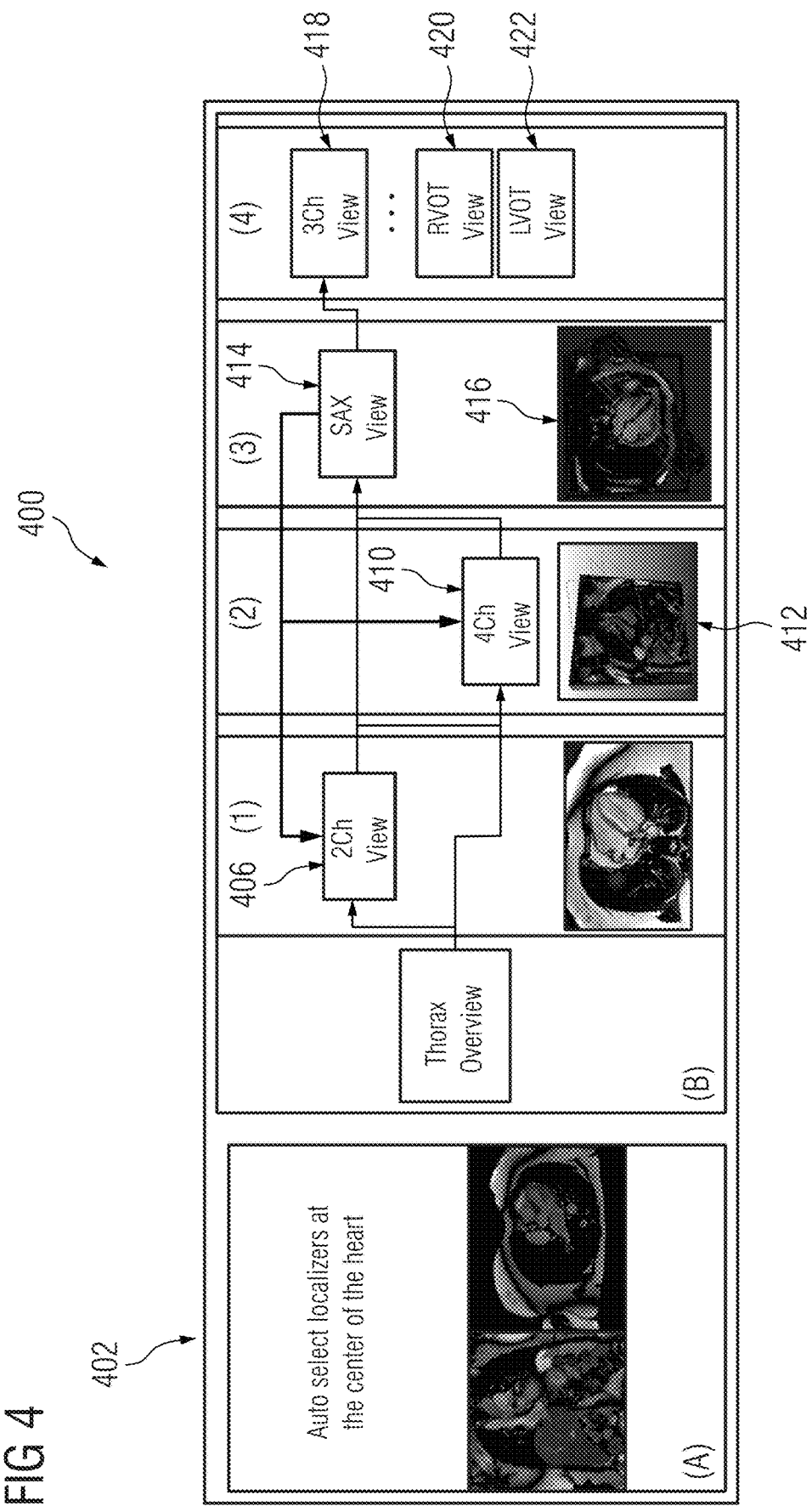
FIG. 4 shows a workflow for acquiring a plurality of target views of the heart of a patient for performing a cardiac MRI examination, in accordance with one or more embodiments.

FIG. 4 shows a workflow 400 for acquiring a plurality of target views of the heart of a patient for performing a cardiac MRI examination, in accordance with one or more embodiments. The specific target views that are acquired are based on guidelines for the cardiac MRI examination for a particular assessment (e.g., functional assessment, tissue viability, aortic stenosis, valve disease, etc.). Each target view may be acquired by performing a respective iteration of method 100 of FIG. 1 using a machine learning based network trained to predict a location for acquiring that target view. In one embodiment of workflow 400, if a machine learning based network trained to predict a location for acquiring a particular target view is not available, a user may manually determine the location for acquiring the target view.

At block 402, one or more localizer images are automatically selected at the center of the heart. The selected localizer images are shown as thorax overview 402 representing two orthogonal co-axial scout images. 2Ch view 406 is acquired according to method 100 of FIG. 1 using thorax overview 404 as the input image. 2Ch view 406 is shown as image 408. 4Ch view 410 is acquired according to method 100 of FIG. 1 using one image of thorax overview 404 as the input image, (optionally) the other image of thorax overview 404 an additional input image, and 2Ch view 406 as another additional input image. 4Ch view 410 is shown as image 412. SAX view 414 is acquired according to method 100 of FIG. 1 using 2Ch view 406 as the input image and 4Ch view 410 as an additional input image (or vice versa). In particular, a mid-SAX view is acquired from 2Ch view 406 and 4Ch view 410, basal and apical positions are acquired from 2Ch view 406 and 4Ch view 410 to obtain the full SAX stack, and the SAX cine stack can then be acquired. SAX view 414 is shown as image 416. In one embodiment, as shown in workflow 400, 2Ch view 406 and/or 4Ch view 410 may be reacquired using SAX view 414. 3Ch view 418, RVOT view 420, LVOT view 422, and other target views may be acquired according to method 100 of FIG. 1 using SAX view 414 as the input image.

Figure 5:
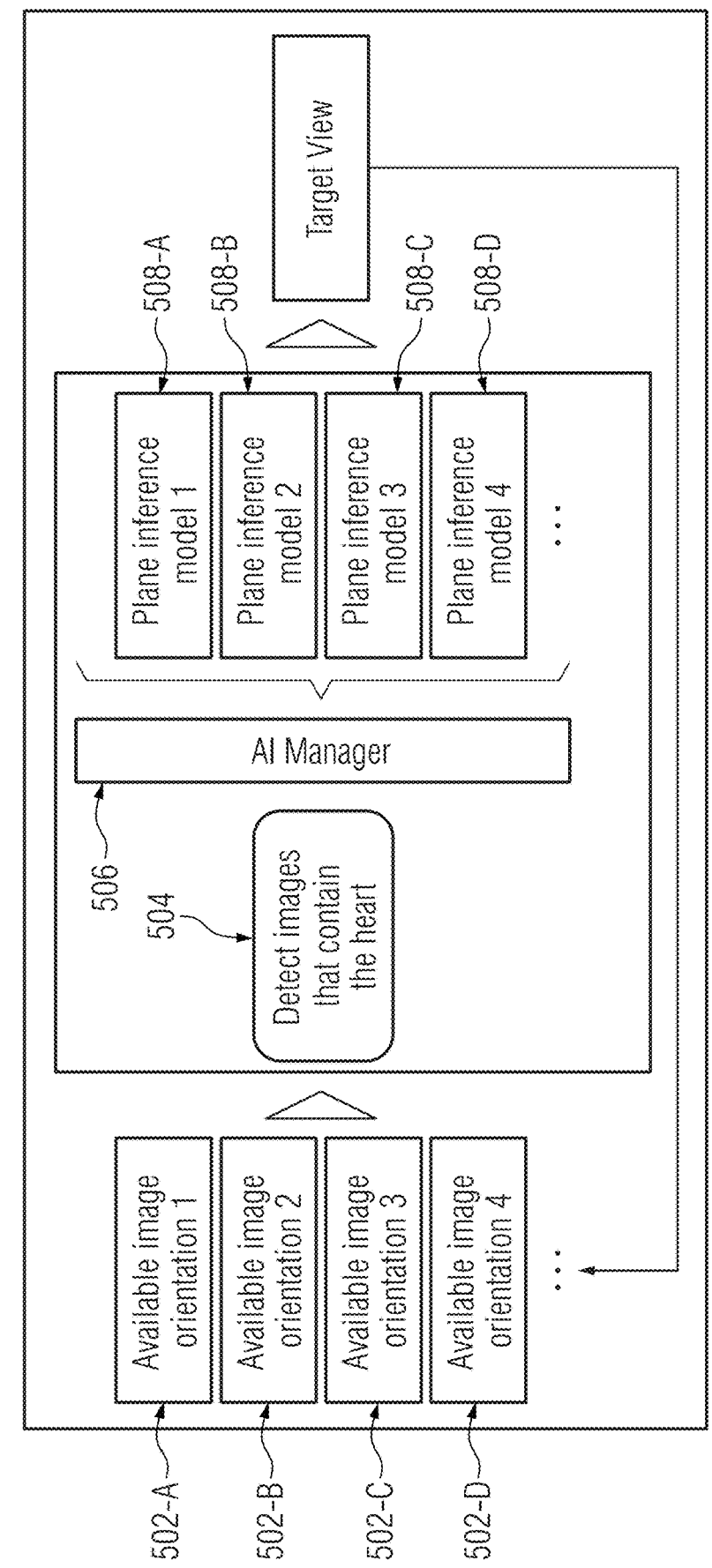
FIG. 5 shows a workflow for AI (artificial intelligence) based target view acquisition prediction, in accordance with one or more embodiments.

FIG. 5 shows a workflow 500 for AI (artificial intelligence) based target view acquisition prediction, in accordance with one or more embodiments. An AI manager 506 assesses available input images, which may comprise available image orientation 1 502-A, available image orientation 2 502-B, available image orientation 3 502-C, available image orientation 4 502-D, etc. (collectively referred to as available images 502). The available images 502 may include localizer images, acquired target views of the heart, or any other suitable image. At block 504, AI manager 506 detects images of the available images 502 (e.g., using a classifier) that contain the heart. The AI manager then determines a next target view that should be acquired in accordance with guidelines for performing a cardiac MRI examination for a particular assessment and automatically selects a machine learning based network, from a plurality of machine learning based networks, trained for predicting a location for acquiring specific target views. The plurality of machine learning based networks include plane inference model 1 508-A, plane inference model 2 508-B, plane inference model 3 508-C, plane inference model 4 508-D, etc. (collectively referred to as models 508). Target view 510 is then acquired based on the location for acquiring target view 510 predicted by the selected model 508. Target view 510 may then be included in available images 502 for acquiring another target view. In one embodiment, the AI manager may also automatically perform image analysis tasks on the acquired target views, such as, e.g., cardiac function evaluation, regurgitant fraction computation, tissue characterization, etc. Based on the results of the image analysis tasks, the AI manager may recommend additional target views to be acquired that may be helpful for diagnosis.

In one embodiment, a machine learning based network may be trained to evaluate acquired target views for a cardiac MRI examination for quality control. The acquired target views may be target views acquired in accordance with method 100 of FIG. 1. The machine learning based network may evaluate acquired target views to identify low quality image scans, incomplete ventricle coverage, wrong views, or other acquired target views that are not suitable for the cardiac MRI examination. The identified target views may be reacquired or a user may be prompted to recheck the image position.

In one embodiment, the location for acquiring a target view of the anatomical object of interest predicted in accordance with method 100 of FIG. 1 may be compensated for motion (e.g., breathing motion) of the patient. Localizer input images may be acquired while the patient is freely breathing. The acquired localizer images may then be adjusted according to a reference breathing state (e.g., the end of expiration). The adjustment may be performed based on relative breathing positions using fiducials or other advanced respiratory sensors. Advantageously, input localizer images do not have to be acquired during a breath hold state of the patient, allowing for easier scanning of uncooperative patients or patients who are unable to hold their breath. Further, scan time of the input localizer images would be reduced, as the scanning does not have to stop for breathing instruction.

Embodiments described herein are described with respect to the claimed systems as well as with respect to the claimed methods. Features, advantages or alternative embodiments herein can be assigned to the other claimed objects and vice versa. In other words, claims for the systems can be improved with features described or claimed in the context of the methods. In this case, the functional features of the method are embodied by objective units of the providing system.

Furthermore, certain embodiments described herein are described with respect to methods and systems for predicting a location for acquiring a target view of an anatomical object of interest in an input image using machine learning based networks, as well as with respect to methods and systems for training a machine learning based network for predicting a location for acquiring a target view of an anatomical object of interest in an input image. Features, advantages or alternative embodiments herein can be assigned to the other claimed objects and vice versa. In other words, claims for methods and systems for training a machine learning based network can be improved with features described or claimed in context of the methods and systems for utilizing a trained machine learning based network, and vice versa.

In particular, the trained machine learning based networks applied in the methods and systems for predicting a location for acquiring a target view of an anatomical object of interest in an input image using machine learning based networks can be adapted by the methods and systems for training the machine learning based network for predicting a location for acquiring a target view of an anatomical object of interest in an input image using machine learning based networks. Furthermore, the input data of the trained machine learning based network can comprise advantageous features and embodiments of the training input data, and vice versa. Furthermore, the output data of the trained machine learning based network can comprise advantageous features and embodiments of the output training data, and vice versa.

In general, a trained machine learning based network mimics cognitive functions that humans associate with other human minds. In particular, by training based on training data, the trained machine learning based network is able to adapt to new circumstances and to detect and extrapolate patterns.

In general, parameters of a machine learning based network can be adapted by means of training. In particular, supervised training, semi-supervised training, unsupervised training, reinforcement learning and/or active learning can be used. Furthermore, representation learning (an alternative term is "feature learning") can be used. In particular, the parameters of the trained machine learning based network can be adapted iteratively by several steps of training.

In particular, a trained machine learning based network can comprise a neural network, a support vector machine, a decision tree, and/or a Bayesian network, and/or the trained machine learning based network can be based on k-means clustering, Q-learning, genetic algorithms, and/or association rules. In particular, a neural network can be a deep neural network, a convolutional neural network, or a convolutional deep neural network. Furthermore, a neural network can be an adversarial network, a deep adversarial network and/or a generative adversarial network.

Figure 6:
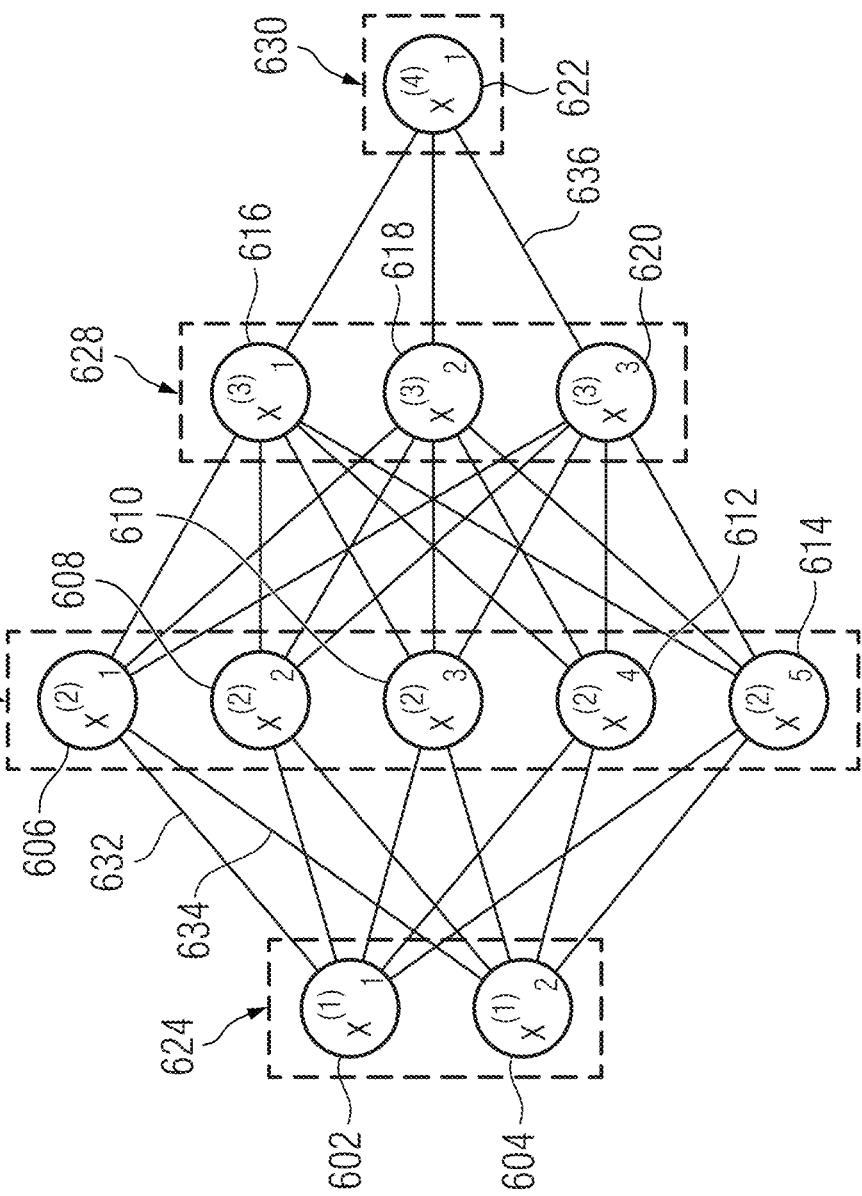
FIG. 6 shows an exemplary artificial neural network that may be used to implement one or more embodiments.

FIG. 6 shows an embodiment of an artificial neural network 600, in accordance with one or more embodiments. Alternative terms for "artificial neural network" are "neural network", "artificial neural net" or "neural net". Machine learning networks described herein, such as, e.g., the machine learning based model applied at step 104 of FIG. 1, may be implemented using artificial neural network 600.

The artificial neural network 600 comprises nodes 602-622 and edges 632, 634, . . . , 636, wherein each edge 632, 634, . . . , 636 is a directed connection from a first node 602-622 to a second node 602-622. In general, the first node 602-622 and the second node 602-622 are different nodes 602-622, it is also possible that the first node 602-622 and the second node 602-622 are identical. For example, in FIG. 6, the edge 632 is a directed connection from the node 602 to the node 606, and the edge 634 is a directed connection from the node 604 to the node 606. An edge 632, 634, . . . , 636 from a first node 602-622 to a second node 602-622 is also denoted as "ingoing edge" for the second node 602-622 and as "outgoing edge" for the first node 602-622.

In this embodiment, the nodes 602-622 of the artificial neural network 600 can be arranged in layers 624-630, wherein the layers can comprise an intrinsic order introduced by the edges 632, 634, . . . , 636 between the nodes 602-622. In particular, edges 632, 634, . . . , 636 can exist only between neighboring layers of nodes. In the embodiment shown in FIG. 6, there is an input layer 624 comprising only nodes 602 and 604 without an incoming edge, an output layer 630 comprising only node 622 without outgoing edges, and hidden layers 626, 628 in-between the input layer 624 and the output layer 630. In general, the number of hidden layers 626, 628 can be chosen arbitrarily. The number of nodes 602 and 604 within the input layer 624 usually relates to the number of input values of the neural network 600, and the number of nodes 622 within the output layer 630 usually relates to the number of output values of the neural network 600.

In particular, a (real) number can be assigned as a value to every node 602-622 of the neural network 600. Here, $x_i^{(n)}$ denotes the value of the i-th node 602-622 of the n-th layer 624-630. The values of the nodes 602-622 of the input layer 624 are equivalent to the input values of the neural network 600, the value of the node 622 of the output layer 630 is equivalent to the output value of the neural network 600. Furthermore, each edge 632, 634, . . . , 636 can comprise a weight being a real number, in particular, the weight is a real number within the interval [−1, 1] or within the interval [0, 1]. Here, $w_{i,j}^{(m,n)}$ denotes the weight of the edge between the i-th node 602-622 of the m-th layer 624-630 and the j-th node 602-622 of the n-th layer 624-630. Furthermore, the abbreviation $w_{i,j}^{(n)}$ is defined for the weight $w_{i,j}^{(n,n+1)}$.

In particular, to calculate the output values of the neural network 600, the input values are propagated through the neural network. In particular, the values of the nodes 602-622 of the (n+1)-th layer 624-630 can be calculated based on the values of the nodes 602-622 of the n-th layer 624-630 by $$x_j^{(n+1)} = f(\Sigma_i x_i^{(n)} \cdot w_{i,j}^{(n)}).$$

Herein, the function f is a transfer function (another term is "activation function"). Known transfer functions are step functions, sigmoid function (e.g. the logistic function, the generalized logistic function, the hyperbolic tangent, the Arctangent function, the error function, the smoothstep function) or rectifier functions The transfer function is mainly used for normalization purposes.

In particular, the values are propagated layer-wise through the neural network, wherein values of the input layer 624 are given by the input of the neural network 600, wherein values of the first hidden layer 626 can be calculated based on the values of the input layer 624 of the neural network, wherein values of the second hidden layer 628 can be calculated based in the values of the first hidden layer 626, etc.

In order to set the values $w^{(m,n)}_{i,j}$ for the edges, the neural network 600 has to be trained using training data. In particular, training data comprises training input data and training output data (denoted as $t_i$). For a training step, the neural network 600 is applied to the training input data to generate calculated output data. In particular, the training data and the calculated output data comprise a number of values, said number being equal with the number of nodes of the output layer.

In particular, a comparison between the calculated output data and the training data is used to recursively adapt the weights within the neural network 600 (backpropagation algorithm). In particular, the weights are changed according to $$w'^{(n)}_{i,j} = w^{(n)}_{i,j} - \gamma \cdot \delta^{(n)}_j \cdot x^{(n)}_i$$

wherein $\gamma$ is a learning rate, and the numbers $\delta^{(n)}_j$ can be recursively calculated as $$\delta^{(n)}_j = (\Sigma_k \delta^{(n+1)}_k \cdot w^{(n+1)}_{j,k}) \cdot f'(\Sigma_i x^{(n)}_i \cdot w^{(n)}_{i,j})$$

based on $\delta^{(n+1)}_j$, if the (n+1)-th layer is not the output layer, and $$\delta^{(n)}_j = (x^{(n+1)}_k - t^{(n+1)}_j) \cdot f'(\Sigma_i x^{(n)}_i \cdot w^{(n)}_{i,j})$$

if the (n+1)-th layer is the output layer 630, wherein f' is the first derivative of the activation function, and $y^{(n+1)}_j$ is the comparison training value for the j-th node of the output layer 630.

Figure 7:
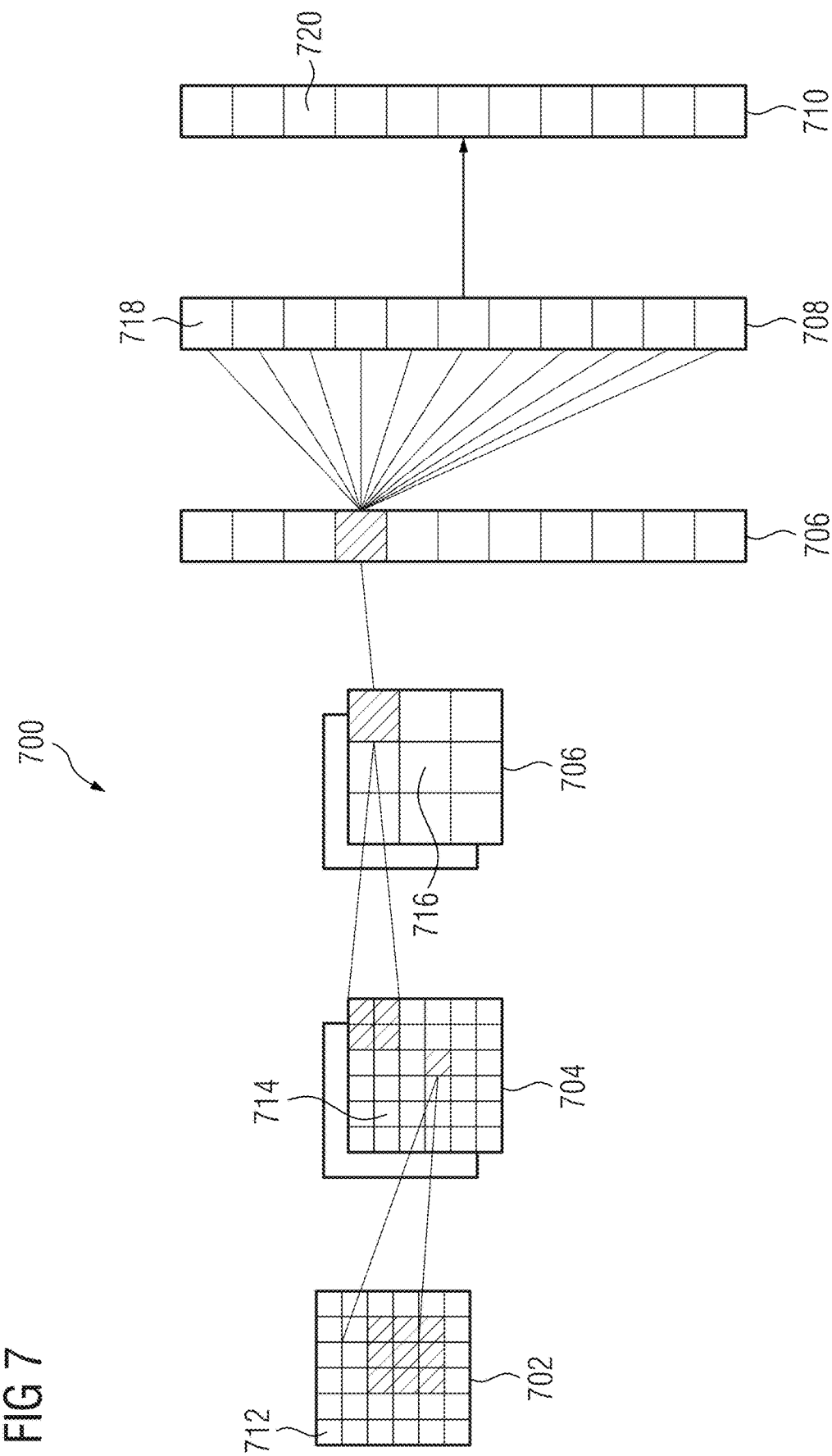
FIG. 7 shows a convolutional neural network that may be used to implement one or more embodiments.

FIG. 7 shows a convolutional neural network 700, in accordance with one or more embodiments. Machine learning networks described herein, such as, e.g., the machine learning based model applied at step 104 of FIG. 1, may be implemented using convolutional neural network 700.

In the embodiment shown in FIG. 7, the convolutional neural network comprises 700 an input layer 702, a convolutional layer 704, a pooling layer 706, a fully connected layer 708, and an output layer 710. Alternatively, the convolutional neural network 700 can comprise several convolutional layers 704, several pooling layers 706, and several fully connected layers 708, as well as other types of layers. The order of the layers can be chosen arbitrarily, usually fully connected layers 708 are used as the last layers before the output layer 710.

In particular, within a convolutional neural network 700, the nodes 712-720 of one layer 702-710 can be considered to be arranged as a d-dimensional matrix or as a d-dimensional image. In particular, in the two-dimensional case the value of the node 712-720 indexed with i and j in the n-th layer 702-710 can be denoted as $x^{(n)}_{[i,j]}$. However, the arrangement of the nodes 712-720 of one layer 702-710 does not have an effect on the calculations executed within the convolutional neural network 700 as such, since these are given solely by the structure and the weights of the edges.

In particular, a convolutional layer 704 is characterized by the structure and the weights of the incoming edges forming a convolution operation based on a certain number of kernels. In particular, the structure and the weights of the incoming edges are chosen such that the values $x^{(n)}_k$ of the nodes 714 of the convolutional layer 704 are calculated as a convolution $x^{(n)}_k = K_k * x^{(n-1)}$ based on the values $x^{(n-1)}$ of the nodes 712 of the preceding layer 702, where the convolution * is defined in the two-dimensional case as $$x^{(n)}_k[i,j] = (K_k * x^{(n-1)})[i,j] = \Sigma_{i'} \Sigma_{j'} K_k[i',j'] \cdot x^{(n-1)}[i-i',j-j'].$$

Here the k-th kernel $K_k$ is a d-dimensional matrix (in this embodiment a two-dimensional matrix), which is usually small compared to the number of nodes 712-718 (e.g. a 3×3 matrix, or a 5×5 matrix). In particular, this implies that the weights of the incoming edges are not independent, but chosen such that they produce said convolution equation. In particular, for a kernel being a 3×3 matrix, there are only 9 independent weights (each entry of the kernel matrix corresponding to one independent weight), irrespectively of the number of nodes 712-720 in the respective layer 702-710. In particular, for a convolutional layer 704, the number of nodes 714 in the convolutional layer is equivalent to the number of nodes 712 in the preceding layer 702 multiplied with the number of kernels.

If the nodes 712 of the preceding layer 702 are arranged as a d-dimensional matrix, using a plurality of kernels can be interpreted as adding a further dimension (denoted as "depth" dimension), so that the nodes 714 of the convolutional layer 704 are arranged as a (d+1)-dimensional matrix. If the nodes 712 of the preceding layer 702 are already arranged as a (d+1)-dimensional matrix comprising a depth dimension, using a plurality of kernels can be interpreted as expanding along the depth dimension, so that the nodes 714 of the convolutional layer 704 are arranged also as a (d+1)-dimensional matrix, wherein the size of the (d+1)-dimensional matrix with respect to the depth dimension is by a factor of the number of kernels larger than in the preceding layer 702.

The advantage of using convolutional layers 704 is that spatially local correlation of the input data can exploited by enforcing a local connectivity pattern between nodes of adjacent layers, in particular by each node being connected to only a small region of the nodes of the preceding layer.

In embodiment shown in FIG. 7, the input layer 702 comprises 36 nodes 712, arranged as a two-dimensional 6×6 matrix. The convolutional layer 704 comprises 72 nodes 714, arranged as two two-dimensional 6×6 matrices, each of the two matrices being the result of a convolution of the values of the input layer with a kernel. Equivalently, the nodes 714 of the convolutional layer 704 can be interpreted as arranges as a three-dimensional 6×6×2 matrix, wherein the last dimension is the depth dimension.

A pooling layer 706 can be characterized by the structure and the weights of the incoming edges and the activation function of its nodes 716 forming a pooling operation based on a non-linear pooling function f. For example, in the two dimensional case the values $x^{(n)}$ of the nodes 716 of the pooling layer 706 can be calculated based on the values $x^{(n-1)}$ of the nodes 714 of the preceding layer 704 as $$x^{(n)}[i,j] = f(x^{(n-1)}[id_1, jd_2], \ldots, x^{(n-1)}[id_1+d_1-1, jd_2+d_2-1])$$

In other words, by using a pooling layer 706, the number of nodes 714, 716 can be reduced, by replacing a number $d1 \cdot d2$ of neighboring nodes 714 in the preceding layer 704 with a single node 716 being calculated as a function of the values of said number of neighboring nodes in the pooling layer. In particular, the pooling function f can be the max-function, the average or the L2-Norm. In particular, for a pooling layer 706 the weights of the incoming edges are fixed and are not modified by training.

The advantage of using a pooling layer 706 is that the number of nodes 714, 716 and the number of parameters is reduced. This leads to the amount of computation in the network being reduced and to a control of overfitting.

In the embodiment shown in FIG. 7, the pooling layer 706 is a max-pooling, replacing four neighboring nodes with only one node, the value being the maximum of the values of the four neighboring nodes. The max-pooling is applied to each d-dimensional matrix of the previous layer; in this embodiment, the max-pooling is applied to each of the two two-dimensional matrices, reducing the number of nodes from 72 to 18.

A fully-connected layer 708 can be characterized by the fact that a majority, in particular, all edges between nodes 716 of the previous layer 706 and the nodes 718 of the fully-connected layer 708 are present, and wherein the weight of each of the edges can be adjusted individually.

In this embodiment, the nodes 716 of the preceding layer 706 of the fully-connected layer 708 are displayed both as two-dimensional matrices, and additionally as non-related nodes (indicated as a line of nodes, wherein the number of nodes was reduced for a better presentability). In this embodiment, the number of nodes 718 in the fully connected layer 708 is equal to the number of nodes 716 in the preceding layer 706. Alternatively, the number of nodes 716, 718 can differ.

Furthermore, in this embodiment, the values of the nodes 720 of the output layer 710 are determined by applying the Softmax function onto the values of the nodes 718 of the preceding layer 708. By applying the Softmax function, the sum the values of all nodes 720 of the output layer 710 is 1, and all values of all nodes 720 of the output layer are real numbers between 0 and 1.

A convolutional neural network 700 can also comprise a ReLU (rectified linear units) layer or activation layers with non-linear transfer functions. In particular, the number of nodes and the structure of the nodes contained in a ReLU layer is equivalent to the number of nodes and the structure of the nodes contained in the preceding layer. In particular, the value of each node in the ReLU layer is calculated by applying a rectifying function to the value of the corresponding node of the preceding layer.

The input and output of different convolutional neural network blocks can be wired using summation (residual/dense neural networks), element-wise multiplication (attention) or other differentiable operators. Therefore, the convolutional neural network architecture can be nested rather than being sequential if the whole pipeline is differentiable.

In particular, convolutional neural networks 700 can be trained based on the backpropagation algorithm. For preventing overfitting, methods of regularization can be used, e.g. dropout of nodes 712-720, stochastic pooling, use of artificial data, weight decay based on the L1 or the L2 norm, or max norm constraints. Different loss functions can be combined for training the same neural network to reflect the joint training objectives. A subset of the neural network parameters can be excluded from optimization to retain the weights pretrained on another datasets.

Systems, apparatuses, and methods described herein may be implemented using digital circuitry, or using one or more computers using well-known computer processors, memory units, storage devices, computer software, and other components. Typically, a computer includes a processor for executing instructions and one or more memories for storing instructions and data. A computer may also include, or be coupled to, one or more mass storage devices, such as one or more magnetic disks, internal hard disks and removable disks, magneto-optical disks, optical disks, etc.

Systems, apparatus, and methods described herein may be implemented using computers operating in a client-server relationship. Typically, in such a system, the client computers are located remotely from the server computer and interact via a network. The client-server relationship may be defined and controlled by computer programs running on the respective client and server computers.

Systems, apparatus, and methods described herein may be implemented within a network-based cloud computing system. In such a network-based cloud computing system, a server or another processor that is connected to a network communicates with one or more client computers via a network. A client computer may communicate with the server via a network browser application residing and operating on the client computer, for example. A client computer may store data on the server and access the data via the network. A client computer may transmit requests for data, or requests for online services, to the server via the network. The server may perform requested services and provide data to the client computer(s). The server may also transmit data adapted to cause a client computer to perform a specified function, e.g., to perform a calculation, to display specified data on a screen, etc. For example, the server may transmit a request adapted to cause a client computer to perform one or more of the steps or functions of the methods and workflows described herein, including one or more of the steps or functions of FIG. 1. Certain steps or functions of the methods and workflows described herein, including one or more of the steps or functions of FIG. 1, may be performed by a server or by another processor in a network-based cloud-computing system. Certain steps or functions of the methods and workflows described herein, including one or more of the steps of FIG. 1, may be performed by a client computer in a network-based cloud computing system. The steps or functions of the methods and workflows described herein, including one or more of the steps of FIG. 1, may be performed by a server and/or by a client computer in a network-based cloud computing system, in any combination.

Systems, apparatus, and methods described herein may be implemented using a computer program product tangibly embodied in an information carrier, e.g., in a non-transitory machine-readable storage device, for execution by a programmable processor; and the method and workflow steps described herein, including one or more of the steps or functions of FIG. 1, may be implemented using one or more computer programs that are executable by such a processor. A computer program is a set of computer program instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

A high-level block diagram of an example computer 802 that may be used to implement systems, apparatus, and methods described herein is depicted in FIG. 8. Computer 802 includes a processor 804 operatively coupled to a data storage device 812 and a memory 810. Processor 804 controls the overall operation of computer 802 by executing computer program instructions that define such operations. The computer program instructions may be stored in data storage device 812, or other computer readable medium, and loaded into memory 810 when execution of the computer program instructions is desired. Thus, the method and workflow steps or functions of FIG. 2 can be defined by the computer program instructions stored in memory 810 and/or data storage device 812 and controlled by processor 804 executing the computer program instructions. For example, the computer program instructions can be implemented as computer executable code programmed by one skilled in the art to perform the method and workflow steps or functions of FIG. 1. Accordingly, by executing the computer program instructions, the processor 804 executes the method and workflow steps or functions of FIG. 1. Computer 802 may also include one or more network interfaces 806 for communicating with other devices via a network. Computer 802 may also include one or more input/output devices 808 that enable user interaction with computer 802 (e.g., display, keyboard, mouse, speakers, buttons, etc.).

Processor 804 may include both general and special purpose microprocessors, and may be the sole processor or one of multiple processors of computer 802. Processor 804 may include one or more central processing units (CPUs), for example. Processor 804, data storage device 812, and/or memory 810 may include, be supplemented by, or incorporated in, one or more application-specific integrated circuits (ASICs) and/or one or more field programmable gate arrays (FPGAs).

Data storage device 812 and memory 810 each include a tangible non-transitory computer readable storage medium. Data storage device 812, and memory 810, may each include high-speed random access memory, such as dynamic random access memory (DRAM), static random access memory (SRAM), double data rate synchronous dynamic random access memory (DDR RAM), or other random access solid state memory devices, and may include non-volatile memory, such as one or more magnetic disk storage devices such as internal hard disks and removable disks, magneto-optical disk storage devices, optical disk storage devices, flash memory devices, semiconductor memory devices, such as erasable programmable read-only memory (EPROM), electrically erasable programmable read-only memory (EEPROM), compact disc read-only memory (CD-ROM), digital versatile disc read-only memory (DVD-ROM) disks, or other non-volatile solid state storage devices.

Input/output devices 808 may include peripherals, such as a printer, scanner, display screen, etc. For example, input/output devices 808 may include a display device such as a cathode ray tube (CRT) or liquid crystal display (LCD) monitor for displaying information to the user, a keyboard, and a pointing device such as a mouse or a trackball by which the user can provide input to computer 802.

An image acquisition device 814 can be connected to the computer 802 to input image data (e.g., medical images) to the computer 802. It is possible to implement the image acquisition device 814 and the computer 802 as one device. It is also possible that the image acquisition device 814 and the computer 802 communicate wirelessly through a network. In a possible embodiment, the computer 802 can be located remotely with respect to the image acquisition device 814.

Any or all of the systems and apparatus discussed herein, the machine learning based model applied at step 104 of FIG. 1, may be implemented using one or more computers such as computer 802.

One skilled in the art will recognize that an implementation of an actual computer or computer system may have other structures and may contain other components as well, and that FIG. 8 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method comprising:
receiving an input image of an anatomical object of interest of a patient;
generating an output image using a machine learning based network, the machine learning based network receiving as input the input image and generating as output the output image depicting a projection of a 3D image plane representing a location for acquiring a target view of the anatomical object of interest in the input image, the projection of the 3D image plane determined based on an intersection of an imaging plane of the input image and an imaging plane of the target view; and
outputting the output image.

2. The method of claim 1, wherein the projection of the 3D image plane for acquiring the target view of the anatomical object of interest is represented as a continuous region defined by a pair of boundary lines in the input image, the continuous region determined by computing a distance transform based on a distance between the intersection and points extending away from the intersection.

3. The method of claim 1, wherein the projection of the 3D image plane for acquiring the target view of the anatomical object of interest comprises a line in the input image representing the intersection.

4. The method of claim 1, further comprising receiving one or more additional input images of the anatomical object of interest, wherein generating an output image using a machine learning based network comprises:
generating the output image using the machine learning based network based on the one or more additional input images.

5. The method of claim 1, wherein the input image comprises a localizer image.

6. The method of claim 1, wherein the input image comprises a previously acquired target view of the anatomical object of interest.

7. The method of claim 1, wherein the anatomical object of interest is a heart of the patient.

8. The method of claim 7, wherein the target view comprises one of a short axis view, a 2-chamberview, a 3-chamberview, or a 4-chamberview of the heart.

9. The method of claim 1, further comprising:
acquiring the target view of the anatomical object of interest based on the output image.

10. An apparatus comprising:
means for receiving an input image of an anatomical object of interest of a patient;
means for generating an output image using a machine learning based network, the machine learning based network receiving as input the input image and generating as output the output image depicting a projection of a 3D image plane representing a location for acquiring a target view of the anatomical object of interest in the input image, the projection of the 3D image plane determined based on an intersection of an imaging plane of the input image and an imaging plane of the target view; and
means for outputting the output image.

11. The apparatus of claim 10, wherein the projection of the 3D image plane for acquiring the target view of the anatomical object of interest is represented as a continuous region defined by a pair of boundary lines in the input image, the continuous region determined by computing a distance transform based on a distance between the intersection and points extending away from the intersection.

12. The apparatus of claim 10, wherein the projection of the 3D image plane for acquiring the target view of the anatomical object of interest comprises a line in the input image representing the intersection.

13. A non-transitory computer readable medium storing computer program instructions, the computer program instructions when executed by a processor cause the processor to perform operations comprising:
    receiving an input image of an anatomical object of interest of a patient;
    generating an output image using a machine learning based network, the machine learning based network receiving as input the input image and generating as output the output image depicting a projection of a 3D image plane representing a location for acquiring a target view of the anatomical object of interest in the input image, the projection of the 3D image plane determined based on an intersection of an imaging plane of the input image and an imaging plane of the target view; and
    outputting the output image.

14. The non-transitory computer readable medium of claim 13, the operations further comprising receiving one or more additional input images of the anatomical object of interest, wherein generating an output image using a machine learning based network comprises:
    generating the output image using the machine learning based network based on the one or more additional input images.

15. The non-transitory computer readable medium of claim 13, wherein the input image comprises a localizer image.

16. The non-transitory computer readable medium of claim 13, wherein the input image comprises a previously acquired target view of the anatomical object of interest.

17. The non-transitory computer readable medium of claim 13, wherein the anatomical object of interest is a heart of the patient.

18. The non-transitory computer readable medium of claim 17, wherein the target view comprises one of a short axis view, a 2-chamberview, a 3-chamberview, or a 4-chamberview of the heart.

* * * * *